United States Patent
Summers

(10) Patent No.: US 9,190,188 B2
(45) Date of Patent: Nov. 17, 2015

(54) PHOTONIC SINTERING OF POLYMER THICK FILM COPPER CONDUCTOR COMPOSITIONS

(71) Applicant: E I DU PONT DE NEMOURS AND COMPANY, Wilmington, DE (US)

(72) Inventor: John D Summers, Chapel Hill, NC (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 154 days.

(21) Appl. No.: 13/916,759

(22) Filed: Jun. 13, 2013

(65) Prior Publication Data

US 2014/0367619 A1  Dec. 18, 2014

(51) Int. Cl.
| | | |
|---|---|---|
| H01B 1/22 | (2006.01) | |
| B05D 5/12 | (2006.01) | |
| H05K 1/09 | (2006.01) | |

(52) U.S. Cl.
CPC .. *H01B 1/22* (2013.01); *B05D 5/12* (2013.01); *H05K 1/095* (2013.01); *H05K 2201/0245* (2013.01); *H05K 2203/1131* (2013.01); *H05K 2203/1157* (2013.01)

(58) Field of Classification Search
CPC .............. H01B 1/16; H01B 1/22; C09D 5/24; H05K 1/095; H05K 3/1216; B05D 5/12
See application file for complete search history.

(56) References Cited

U.S. PATENT DOCUMENTS

| | | | | |
|---|---|---|---|---|
| 4,663,079 A | * | 5/1987 | Yamaguchi et al. | 252/512 |
| 5,064,469 A | * | 11/1991 | Mack | 106/14.42 |
| 5,204,025 A | * | 4/1993 | Yamada et al. | 252/500 |
| 2008/0020304 A1 | | 1/2008 | Schroder et al. | |
| 2009/0181184 A1 | | 7/2009 | Pope et al. | |
| 2011/0180137 A1 | | 7/2011 | Iwamuro et al. | |
| 2012/0119153 A1 | * | 5/2012 | Choi | 252/500 |
| 2013/0001774 A1 | * | 1/2013 | Masumori et al. | 257/737 |
| 2013/0142963 A1 | | 6/2013 | Kirk et al. | |

FOREIGN PATENT DOCUMENTS

| | | |
|---|---|---|
| EP | 0 239 901 A2 | 10/1987 |
| JP | 362074967 A * | 4/1987 |
| JP | 362230869 A * | 10/1987 |
| JP | 401020276 A * | 1/1989 |
| WO | 2009/111393 A2 | 9/2009 |

OTHER PUBLICATIONS (PCT/US2014/041196) International Search Report and Written Opinion dated Mar. 31, 2015.

* cited by examiner

*Primary Examiner* — Mark Kopec

(57) ABSTRACT

This invention provides a method for using a polymer thick film copper conductor composition to form an electrical conductor in an electrical circuit, the method subjecting the deposited thick film copper conductor composition to photonic sintering. The invention also provides a method for reducing the resistance of an electrical conductor formed from a polymer thick film conductor composition, the method comprising the step of subjecting the electrical conductor to photonic sintering. The invention further provides devices containing electrical conductors made by these methods. The invention also provides a polymer thick film copper conductor composition.

4 Claims, No Drawings

PHOTONIC SINTERING OF POLYMER THICK FILM COPPER CONDUCTOR COMPOSITIONS

FIELD OF THE INVENTION

The invention is directed to the photonic curing of polymer thick film (PTF) copper conductor compositions for use in many different applications. In one embodiment, the PTF copper conductor composition is used as a screen-printed conductor on a thin film substrate such as polyester or ITO-sputtered glass. The PTF copper conductor functions as a grid electrode. This composition may further be used for any other application where conductivity (low resistivity) is required.

BACKGROUND OF THE INVENTION

This invention is directed to a polymer thick film copper conductor composition for use in electronic devices. PTF silver conductors are quite prevalent in electronic circuitry as the conductor of choice due to the low resistivity (<50 milliohms/sq) and the reliability of silver. However, in recent years, the price of silver has tripled to the order of more than $30/troy oz and it is therefore becoming expensive to use in circuitry. Alternatives to silver are being sought with little compromise in electrical properties but at reduced cost. It is the purpose of this invention to provide such an alternative.

SUMMARY OF THE INVENTION

This invention provides a method for forming an electrical conductor in an electrical circuit, comprising:
 a) providing a substrate;
 b) providing a polymer thick film copper conductor composition comprising a reducing agent;
 c) applying said polymer thick film copper conductor composition onto said substrate; and
 d) subjecting said polymer thick film copper conductor composition to photonic sintering to form said electrical conductor.

In an embodiment, the method further comprises a step of drying the thick film copper conductor composition, wherein this step is carried out following step (c) but before step (d). The composition is processed at a time and temperature necessary to remove all solvent. Photonic sintering after drying reduces the resistivity.

In one embodiment, the polymer thick film copper conductor composition comprises:
 (a) 40 to 95 wt % copper powder possessing particles with an average particle size of 0.2 to 10 μm and a surface area/mass ratio in the range of 0.2 to 3.0 m$^2$/g; dispersed in
 (b) 4 to 35 wt % organic medium comprising
  (1) a phenoxy, urethane, ester or oxazoline resin dissolved in
  (2) organic solvent comprising a dibasic ester, glycol ether, alcohol or mixtures thereof
 (c) 0.25 to 5 wt % reducing agent comprising a hydroxyl containing compound; and
 (d) 0.0 to 5 wt % surfactant used as a stabilizing agent;
 wherein the wt % are based on the total weight of the polymer thick film copper conductor composition.

The invention also provides an electrical device comprising an electrical conductor formed by any of the embodiments of the above described method.

The invention further provides a method for reducing the resistance of an electrical conductor formed from a polymer thick film copper conductor composition comprising a reducing agent, the method comprising the step of subjecting the electrical conductor to photonic sintering. The invention also provides an electrical device comprising such an electrical conductor.

DETAILED DESCRIPTION OF INVENTION

Generally, a thick film composition comprises a functional phase that imparts appropriate electrically functional properties to the composition. The functional phase comprises electrically functional powders dispersed in an organic medium that acts as a carrier for the functional phase. Generally, in thick film technology, the composition is fired to burn out the organics and to impart the electrically functional properties. However, in the case of polymer thick films, the organics, other than the solvent, remain as an integral part of the composition after drying. "Organics" as used herein comprise polymer, resin or binder components of the thick film composition. These terms may be used interchangeably and they all mean the same thing.

In one embodiment, the polymer thick film conductor copper composition is a polymer thick film copper conductor composition comprising a copper powder dispersed in an organic medium comprising a polymer resin and a solvent. The components used in this embodiment of the polymer thick film conductor copper composition are discussed below.

Polymer Thick Film Copper Conductor Composition

A. Copper Conductor Powder

The electrically functional powder in the polymer thick film copper conductor composition is a copper conductor powder.

The particle diameter and shape of the copper powder are particularly important and have to be appropriate to the application method. In one embodiment the particles are spherical in shape. In another embodiment the particles are in flake form. In still another embodiment the particles are irregular in shape. The particle size distribution of the copper particles is also critical with respect to the effectiveness of the invention. As a practical matter, the particle size is in the range of 1 to 100 μm. In an embodiment, the average particle size is 0.2 to 10 μm. In addition, the surface area/mass ratio of the copper particles is in the range of 0.2 to 3.0 m$^2$/g. In one embodiment, the copper particles have a flake form.

The polymer thick film copper conductor composition is comprised of 40 to 95 wt % copper powder, wherein the wt % is based on the total weight of the polymer thick film copper conductor composition.

Furthermore, it is known that small amounts of one or more other metals may be added to the copper conductor compositions to modify the properties of the conductor. Some examples of such metals include: gold, silver, nickel, aluminum, platinum, palladium, molybdenum, tungsten, tantalum, tin, indium, lanthanum, gadolinium, boron, ruthenium, cobalt, titanium, yttrium, europium, gallium, sulfur, zinc, silicon, magnesium, barium, cerium, strontium, lead, antimony, conductive carbon, and combinations thereof and others common in the art of thick film compositions. The additional metal(s) may comprise up to about 1.0 percent by weight of the total composition.

B. Organic Medium

The copper powder is typically mixed with an organic medium (vehicle) by mechanical mixing to form a paste-like composition, called "paste", having suitable consistency and rheology for printing. The organic medium must be one in which the solids are dispersible with an adequate degree of stability. The rheological properties of the organic medium must be such that they lend good application properties to the composition. Such properties include: dispersion of solids with an adequate degree of stability, good application of composition, appropriate viscosity, thixotropy, appropriate wettability of the substrate and the solids, a good drying rate, and dried film strength sufficient to withstand rough handling.

The organic medium comprises a solution of polymer in organic solvent(s). In one embodiment, the polymeric resins used are a phenoxy resin prepared by polymerizing bisphenol-A with epichlorohydrin such as PKHH® (InChem. Corp., Rock Hill, S.C.), a polyurethane, or a polyester resin such as Vitel® 2200B (Bostic Limited, Stafford, UK) which allows high weight loading of copper powder and thus helps achieve both good adhesion to substrates and low resistivity (high conductivity), two critical properties for conductors in electronic circuitry. Poly(2-ethyl-2-oxazoline) sold under the trade name Aquazol® is an additional candidate for use as a polymeric binder. Optionally, an elastomer such as an ethylene acrylic elastomer Vamac® (DuPont Co., Wilmington, Del.) can also be incorporated as a minor component to produce a rubber toughened binder which imparts improved flex endurance or crease resistance to the cured conductor traces. If used this elastomeric component would be incorporated in an amount ranging from about 5 to 50 wt % based on the total amount of polymeric binder in the paste.

A wide variety of inert liquids can be used as solvents in the organic medium. The most widely used solvents found in thick film compositions are ethyl acetate and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. In many embodiments of the present invention, solvents such as glycol ethers, ketones, esters and other solvents of like boiling points (in the range of 180° C. to 250° C.), and mixtures thereof may be used. In one embodiment the organic medium comprises dibasic ester DBE-3 (DuPont Co., Wilmington, Del.). Various combinations of these and other solvents are formulated to obtain the viscosity and volatility requirements desired.

The polymer thick film copper conductor composition is comprised of 4 to 35 wt % organic medium, wherein the wt % is based on the total weight of the polymer thick film copper conductor composition.

C. Reducing Agent

Copper powder will generally possess an outer oxide layer consisting of cupric oxide, cuprous oxide, copper hydroxide, or a mixture of two or more of these oxides. The oxide layer is an insulator and can thus inhibit the performance of the copper powder as a conductor. Consequently, the resistivity of the printed traces can be undesirably high. Therefore, the paste composition contains organic compounds that are capable of reducing the copper oxide layer to copper metal during the photonic sintering process. Organic compounds suited for this include carboxylic acid or hydroxyl containing compounds. In one embodiment, the reducing agent is selected from the group consisting of triethanolamine, diethanolamine, monoethanolamine and malonic acid.

The polymer thick film copper conductor composition is comprised of 0.25 to 5 wt % hydroxyl containing compound, wherein the wt % is based on the total weight of the polymer thick film copper conductor composition.

D. Stabilizing Agent

Malonic acid also has the added benefit of enhancing the viscosity stability of the thick film copper conductor paste composition. Other similar compounds include malic acid and tartaric acid. Additionally, additives such as tridecyl acid phosphate (Akzo Chemicals) are also useful in achieving a higher degree of dispersion stability.

The polymer thick film copper conductor composition is comprised of 0 to 5 wt % carboxylic acid containing compound or phosphate containing compound, wherein the wt % is based on the total weight of the polymer thick film copper conductor composition. In one embodiment, the polymer thick film copper conductor composition is comprised of 0.5 to 5 wt % carboxylic acid containing compound, wherein the wt % is based on the total weight of the polymer thick film copper conductor composition.

Application of Thick Films

The polymer thick film copper conductor composition or "paste" is typically deposited on a substrate, e.g., ITO-sputtered glass, that is essentially impermeable to gases and moisture. The substrate can also be a sheet of flexible material. An example is an impermeable plastic such as a composite material made up of a combination of plastic sheet with optional metallic or dielectric layers deposited thereupon. The substrate must be such as to withstand the processing temperature of 140° C. In one embodiment, the substrate can be a build-up of layers with metalized copper paste.

The deposition of the polymer thick film copper composition is performed preferably by screen printing, although other deposition techniques such as stench printing, syringe dispensing or coating techniques can be utilized. In the case of screen-printing, the screen mesh size controls the thickness of deposited thick film.

Photonic Sintering

Photonic sintering uses light to provide high-temperature sintering. Typically, a flash lamp is used to provide the source of light and is operated with a short on time of high power and a duty cycle ranging from a few hertz to tens of hertz. The photonic sintering step is brief, typically less than 1 minute. Photonic sintering may also be referred to as photonic curing. Examples of commercial manufacturers of photonic sintering equipment include NovaCentrix Corp. (Austin, Tex.) and Xenon Corp (Wilmington, Mass.).

The photonic sintering of the deposited thick film conductor composition provides conductors with low resistivity.

In one embodiment, prior to the photonic sintering, the deposited thick film conductor composition is dried by exposure to heat at low temperatures, typically for 5 min at 80° C. In another embodiment, the deposited thick film conductor composition is not dried prior to photonic sintering.

The present invention will be discussed in further detail by giving practical examples. The scope of the present invention, however, is not limited in any way by these practical examples.

EXAMPLES AND COMPARATIVE EXPERIMENTS

Example 1

A PTF copper conductor composition was prepared using copper flake (CI-4000F, Ames Goldsmith Corp, South Glen Falls, N.Y.) having an average particle size of 4 μm. An organic medium was prepared by dissolving a phenoxy resin (PKHH® resin from InChem Corp) having a number average molecular weight of approximately 20,000 in a solvent that was a 50/50 blend of DBE-3 dibasic esters (DuPont, Wilmington, Del.) and Dowanol® DPM dipropylene glycol methyl ether ((Dow Chemical Co., Midland, Mich.). The organic medium contained 20 wt % resin and 80 wt % solvent, wherein the wt % are based on the total weight of the organic medium. The copper powder was then dispersed in the organic medium.

The components of the PTF copper conductor composition were:

| | |
|---|---|
| 74.1 wt % | Copper flake. powder |
| 18.5 wt % | Organic medium |
| 1.8 wt % | Triethanolamine |
| 5.6 wt % | Dowanol ® DPM | wherein the wt % are based on the total weight of the composition.

The components were combined and mixed for 3 minutes in a Thinky-type mixer. The composition was used to screen print a 600 square serpentine pattern on Melinex® ST-505 polyester film (DuPont Teijin Films, Chester, Va.). Using a 325 mesh stainless steel screen, several patterns were printed, and the copper paste was dried at 80° C. for 5 min. in a forced air convection oven. The line resistance was then measured as greater than two megaohms.

The dried serpentine patterns were then subjected to photonic sintering. A PulseForge 3200 sintering unit manufactured by NovaCentrix (Austin, Tex.) was employed. The unit was operated in Basic Mode. The process settings were as follows: pulse voltage: 260 V, pulse length: 800 μsec, overlap factor: 3, web speed: 25 FPM. After processing, the measured line resistance was 30Ω. The average conductor thickness over the 600 square pattern was determined to be 5.1 μm using a profilometer. Therefore the resistivity was calculated to be 10.2 mΩ/□/mil.

The crosshatch adhesion of the sintered conductor was measured according to procedure ASTM D3359. Square-shaped samples were printed on Melinex ST-505 and sintered using the same conditions outlined above. Adhesion to the polyester substrate was rated a five.

Some processed traces were then encapsulated with a polyester encapsulant, others were encapsulated with a fluoropolymer encapsulant by screen printing organic solutions containing the dissolved resins and drying at 140° C. for 10 minutes. This encapsulation process did not change the resistivity of the conductor traces significantly. The encapsulated serpentines as well as the unencapsulated serpentines were then tested for durability by subjecting them to an 180° C. crease test. A 2 kg circular weight was rolled slowly over the folded serpentine to generate a hard crease in the conductor traces, the resistivity was measured before and after this treatment. The average resistivity of the unencapsulated samples, the polyester coated samples, and the fluoropolymer coated samples increased 149%, 98%, and 81% respectively. There were no failures.

The sintered conductor traces, encapsulated and unencapsulated, were also subjected to flex endurance testing to evaluate overall durability. Samples were flexed 180 degrees around a 0.25 inch mandrel. The rest samples were flexed so that the conductive traces were in tension and compression. Samples were tested for 1000 cycles (one cycle equals one compression flex and one tension flex). The average change in resistivity as a result of this treatment was 78%, 34% and 31% for the unencapsulated, polyester encapsulated, and fluoropolymer encapsulated samples respectively. There were no failures.

Example 2

A PTF copper conductor composition was prepared using copper flake (CI-4000F, Ames Goldsmith Corp, South Glen Falls, N.Y.) having an average particle size of 4 μm. An organic medium was prepared by dissolving a polyurethane resin in a solvent of DBE-3 dibasic esters (DuPont, Wilmington, Del.). The organic medium contained 20 wt % resin and 80 wt % solvent, wherein the wt % are based on the total weight of the organic medium. The copper powder was then dispersed in the organic medium.

The components of the PTF copper conductor composition were:

| | |
|---|---|
| 74.1 wt % | Copper flake powder |
| 18.5 wt % | Organic medium |
| 2.0 wt % | Triethanolamine |
| 5.4 wt % | DBE-3 | wherein the wt % are based on the total weight of the composition.

The components were combined and mixed for 3 minutes in a Thinky-type mixer. The composition was used to screen print a 600 square serpentine pattern on Melinex® ST-505 polyester film (DuPont Teijin Films, Chester, Va.). Using a 325 mesh stainless steel screen, several patterns were printed, and the copper paste was dried at 80° C. for 5 min. in a forced air convection oven. The line resistance was then measured as greater than two megaohms.

The dried serpentine patterns were then subjected to photonic sintering. A PulseForge 3200 sintering unit manufactured by NovaCentrix (Austin, Tex.) was employed. The unit was operated in Basic Mode. The process settings were as follows: pulse voltage: 260 V, pulse length: 800 μsec, overlap factor: 4, web speed: 25 FPM. After processing, the measured line resistance was 133Ω. The average conductor thickness over the 600 square pattern was determined to be 8.5 μm using a profilometer. Therefore the resistivity was calculated to be 75.4 mΩ/□/mil.

The crosshatch adhesion of the sintered conductor was measured according to procedure ASTM D3359. Square-shaped samples were printed on Melinex ST-505 and sintered using the same conditions outlined above. Adhesion to the polyester substrate was rated a four.

Some processed traces were then encapsulated with a polyester encapsulant, others were encapsulated with a fluoropolymer encapsulant by screen printing organic solutions containing the dissolved resins and drying at 140° C. for 10 minutes. This encapsulation process did not change the resistivity of the conductor traces significantly. The encapsulated serpentines as well as the unencapsulated serpentines were then tested for durability by subjecting them to an 180° C. crease test. A 2 kg circular weight was rolled slowly over the folded serpentine to generate a hard crease in the conductor traces, the resistivity was measured before and after this treatment. The average resistivity of the unencapsulated samples, the polyester coated samples, and the fluoropolymer coated samples increased 182%, 142%, and 135% respectively. There were no failures.

The sintered conductor traces, encapsulated and unencapsulated, were also subjected to flex endurance testing to evaluate overall durability. Samples were flexed 180 degrees around a 0.25 inch mandrel. The test samples were flexed so that the conductive traces were in tension and compression. Samples were tested for 1000 cycles (one cycle equals one compression flex and one tension flex). The average change in resistivity as a result of this treatment was 64%, 28% and 41% for the unencapsulated, polyester encapsulated, and fluoropolymer encapsulated samples respectively. There were no failures.

Example 3

A PTF copper conductor composition was prepared using copper powder CU-HWQ-1.5 (Fukuda Metal, Kyoto Japan) having an average particle size of 1.5 µm. An organic medium was prepared by dissolving a phenoxy resin (PKHH® resin from InChem Corp) having a number average molecular weight of approximately 20,000 in a solvent of Dowanol® DPM dipropylene glycol methyl ether ((Dow Chemical Co., Midland, Mich.). The organic medium contained 20 wt % resin and 80 wt % solvent, wherein the wt % are based on the total weight of the organic medium. The copper powder was then dispersed in the organic medium.

The components of the PTF copper conductor composition were:

| | |
|---|---|
| 74.1 wt % | Copper powder |
| 18.5 wt % | Organic medium |
| 3.7 wt % | Triethanolamine |
| 3.7 wt % | Dowanol ® DPM | wherein the wt % are based on the total weight of the composition.

The ingredients were combined and this composition was mixed for 3 minutes in a Thinky-type mixer. The composition was used to screen print a 600 square serpentine pattern on Melinex®ST-505 polyester film. Using a 325 mesh stainless steel screen, several patterns were printed, and the copper paste was dried at 80° C. for 5 min. in a forced air convection oven. The line resistance was then measured as greater than two megaohms.

The components were combined and mixed for 3 minutes in a Thinky-type mixer. The composition was used to screen print a 600 square serpentine pattern on Melinex® ST-505 polyester film (DuPont Teijin Films, Chester, Va.). Using a 325 mesh stainless steel screen, several patterns were printed, and the copper paste was dried at 80° C. for 5 min. in a forced air convection oven. The line resistance was then measured as greater than two megaohms.

The dried serpentine patterns were then subjected to photonic sintering. A PulseForge 3200 sintering unit manufactured by NovaCentrix (Austin, Tex.) was employed. The unit was operated in Basic Mode. The process settings were as follows: pulse voltage: 260 V, pulse length: 800 µsec, overlap factor: 3, web speed: 25 FPM. After processing, the measured line resistance was 66Ω. The average conductor thickness over the 600 square pattern was determined to be 5.5 µm using a profilometer. Therefore the resistivity was calculated to be 24.5 mΩ/□/mil.

Printed serpentines were also photonically sintered in the wet as-printed state. The process settings were as follows: pulse voltage: 260 V, pulse length; 800 µsec, overlap factor: 3, web speed: 25 FPM. After processing, the measured line resistance was 70Ω. The average conductor thickness over the 600 square pattern was determined to be 5.4 µm using a profilometer. Therefore the resistivity was calculated to be 25.2 mΩ/□/mil.

The crosshatch adhesion of the sintered conductor was measured according to procedure ASTM D3359. Square-shaped samples were printed on Melinex ST-505 and sintered using the same conditions outlined above. Adhesion to the polyester substrate was rated a five.

Some processed traces were then encapsulated with a polyester encapsulant, others were encapsulated with a fluoropolymer encapsulant by screen printing organic solutions containing the dissolved resins and drying at 140° C. for 10 minutes. This encapsulation process did not change the resistivity of the conductor traces significantly. The encapsulated serpentines as well as the unencapsulated serpentines were then tested for durability by subjecting them to an 180° C. crease test. A 2 kg circular weight was rolled slowly over the folded serpentine to generate a hard crease in the conductor traces, the resistivity was measured before and after this treatment. The average resistivity of the unencapsulated samples, the polyester coated samples, and the fluoropolymer coated samples increased 203%, 134%, and 107% respectively. There were no failures.

The sintered conductor traces, encapsulated and unencapsulated, were also subjected to flex endurance testing to evaluate overall durability. Samples were flexed 180 degrees around a 0.25 inch mandrel. The test samples were flexed so that the conductive traces were in tension and compression, Samples were tested for 1000 cycles (one cycle equals one compression flex and one tension flex). The average change in resistivity as a result of this treatment was 92%, 63% and 58% for the unencapsulated, polyester encapsulated, and fluoropolymer encapsulated samples respectively. There were no failures.

Example 4

A PTF copper conductor composition was prepared using copper flake (CI-6000F, Ames Goldsmith Corp, South Glen Falls, N.Y.) having an average particle size of 6 µm. An organic medium was prepared by dissolving a phenoxy resin (PKHH® resin from InChem Corp) having a number average molecular weight of approximately 20,000 in a solvent of Dowanol® DPM dipropylene glycol methyl ether ((Dow Chemical Co., Midland, Mich.). The organic medium contained 20 wt % resin and 80 wt % solvent, wherein the wt % are based on the total weight of the organic medium. The copper powder was then dispersed in the organic medium.

The components of the PTF copper conductor composition were:

| | |
|---|---|
| 74.1 wt % | Copper flake powder (Ames) |
| 18.5 wt % | Organic medium (20% resin/80% solvent) |
| 1.8 wt % | Triethanolamine |
| 5.6 wt % | Dowanol ® DPM | wherein the wt % are based on the total weight of the composition.

The components were combined and mixed for 3 minutes in a Thinky-type mixer. The composition was used to screen print a 600 square serpentine pattern on Melinex® ST-505 polyester film (DuPont Teijin Films, Chester, Va.). Using a 325 mesh stainless steel screen, several patterns were printed, and the copper paste was dried at 80° C. for 5 min. in a forced air convection oven. The line resistance was then measured as greater than two megaohms.

The dried serpentine patterns were then subjected to photonic sintering. A PulseForge 3200 sintering unit manufactured by NovaCentrix (Austin, Tex.) was employed. The unit was operated in Basic Mode. The process settings were as follows: pulse voltage: 260 V, pulse length: 800 µsec, overlap factor: 3, web speed: 25 FPM. After processing, the measured line resistance was 46Ω. The average conductor thickness over the 600 square pattern was determined to be 4.9 µm using a profilometer. Therefore the resistivity was calculated to be 15 mΩ/□/mil.

The crosshatch adhesion of the sintered conductor was measured according to procedure ASTM D3359. Square-shaped samples were printed on Melinex ST-505 and sintered using the same conditions outlined above, Adhesion to the polyester substrate was rated a five.

Some processed traces were then encapsulated with a polyester encapsulant, others were encapsulated with a fluoropolymer encapsulant by screen printing organic solutions containing the dissolved resins and drying at 140° C. for 10 minutes. This encapsulation process did not change the resistivity of the conductor traces significantly. The encapsulated serpentines as well as the unencapsulated serpentines were then tested for durability by subjecting them to an 180° C. crease test, A 2 kg circular weight was rolled slowly over the folded serpentine to generate a hard crease in the conductor traces, the resistivity was measured before and after this treatment. The average resistivity of the unencapsulated samples, the polyester coated samples, and the fluoropolymer coated samples increased 152%, 106%, and 90% respectively. There were no failures.

The sintered conductor traces, encapsulated and unencapsulated, were also subjected to flex endurance testing to evaluate overall durability. Samples were flexed 180 degrees around a 0.25 inch mandrel. The test samples were flexed so that the conductive traces were in tension and compression. Samples were tested for 1000 cycles (one cycle equals one compression flex and one tension flex). The average change in resistivity as a result of this treatment was 71%, 37% and 46% for the unencapsulated, polyester encapsulated, and fluoropolymer encapsulated samples respectively. There were no failures.

Example 5

A PTF copper conductor composition was prepared using copper flake (CI-4000F, Ames Goldsmith Corp, South Glen Falls, N.Y.) having an average particle size of 4 µm. An organic medium was prepared by dissolving a phenoxy resin (PKHH® resin from InChem Corp) having a number average molecular weight of approximately 20,000 in Dowanol® DPM dipropylene glycol methyl ether ((Dow Chemical Co., Midland, Mich.). The organic medium contained 20 wt % resin and 80 wt % solvent, wherein the wt % are based on the total weight of the organic medium. The copper powder was then dispersed in the organic medium.

The components of the PTF copper conductor composition were:

| | |
|---|---|
| 75.2 wt % | Copper flake powder |
| 15.6 wt % | Organic medium |
| 1.9 wt % | Triethanolamine |
| 0.94 wt % | Tridecyl acid phosphate |
| 6.3 wt % | Dowanol ® DPM | wherein the wt % are based on the total weight of the composition.

The components were combined and mixed for 3 minutes in a Thinky-type mixer. The composition was used to screen print a 600 square serpentine pattern on Melinex® ST-505 polyester film (DuPont Teijin Films, Chester, Va.). Using a 325 mesh stainless steel screen, several patterns were printed, and the copper paste was dried at 80° C. for 5 min. in a forced air convection oven. The line resistance was then measured as approximately 500 Kohm.

The dried serpentine patterns were then subjected to photonic sintering. A PulseForge 3200 sintering unit manufactured by NovaCentrix (Austin, Tex.) was employed. The unit was operated in Basic Mode. The process settings were as follows: pulse voltage: 220 V, pulse length: 1700 µsec; overlap factor: 2, web speed: 25 FPM. After processing, the measured line resistance was 45Ω. The average conductor thickness over the 600 square pattern was determined to be 6.2 µm using a profilometer. Therefore the resistivity was calculated to be 18.6 mΩ/□/mil.

The crosshatch adhesion of the sintered conductor was measured according to procedure ASTM D3359. Square-shaped samples were printed on Melinex ST-505 and sintered using the same conditions outlined above. Adhesion to the polyester substrate was rated a five.

The resistivity of processed samples was measured as the samples aged under ambient conditions, 85/85 conditions; and 80° C. aging in a forced air convection oven. The average resistivity change observed was 2.3%, 15.4%, and 13.1% respectively after 500 hr. aging time. The samples were not encapsulated. Crease resistance of the processed conductor traces was measured by inducing a hard crease using a cylindrical 2 kg weight. The average increase in resistivity of samples subjected to this treatment was 42%. Samples were also exposed to flex endurance testing by repeatedly bending the serpentine patterns at a 180 degree angle around a 0.25 inch mandrel. The average resistivity increase observed after 1000 cycles (2000 flexes) was 86%.

Example 6

A PTF copper conductor composition was prepared using copper flake (CI-4000F, Ames Goldsmith Corp, South Glen Falls, N.Y.) having an average particle size of 4 µm. An organic medium was prepared by dissolving a poly(2-ethyl-2-oxazoline) (Aquazol®500 resin) having a number average molecular weight of approximately 500,000 in terpineol. The organic medium contained 20 wt % resin and 80 wt % solvent, wherein the wt % are based on the total weight of the organic medium. The copper powder was then dispersed in the organic medium.

The components of the PTF copper conductor composition were:

| | |
|---|---|
| 70.3 wt % | Copper flake powder |
| 14.6 wt % | Organic medium |
| 1.5 wt % | Triethanolamine |
| 0.5 wt % | Tridecyl acid phosphate |
| 13.2% wt % | Terpineol | wherein the wt % are based on the total weight of the composition.

The components were combined and mixed for 3 minutes in a Thinky-type mixer. The composition was used to screen print a 600 square serpentine pattern on Melinex® ST-505 polyester film (DuPont Teijin Films, Chester, Va.). Using a 325 mesh stainless steel screen, several patterns were printed, and the copper paste was dried at 80° C. for 5 min. in a forced air convection oven. The line resistance was then measured as approximately 600 Kohm.

The dried serpentine patterns were then subjected to photonic sintering. A PulseForge 3200 sintering unit manufactured by NovaCentrix (Austin, Tex.) was employed. The unit was operated in Basic Mode. The process settings were as follows: pulse voltage: 220V, pulse length: 1600 µsec, overlap factor: 2, web speed: 25 FPM. After processing, the measured line resistance was 52Ω. The average conductor thickness over the 600 square pattern was determined to be 5.2 µm using a profilometer. Therefore the resistivity was calculated to be 18.0 mΩ/□/mil.

The crosshatch adhesion of the sintered conductor was measured according to procedure ASTM D3359. Square-shaped samples were printed on Melinex ST-505 and sintered using the same conditions outlined above. Adhesion to the polyester substrate was rated a four.

The resistivity of processed samples was measured as the samples aged under ambient conditions, 85/85 conditions, and 80° C. aging in a forced air convection oven. The average resistivity change observed was 2.8%, 23.4%, and 12.1% respectively after 500 hr. aging time. The samples were not encapsulated. Crease resistance of the processed conductor traces was measured by inducing a hard crease using a cylindrical 2 kg weight. The average increase in resistivity of samples subjected to this treatment was 22%. Samples were also exposed to flex endurance testing by repeatedly bending the serpentine patterns at a 180 degree angle around a 0.25 inch mandrel. The average resistivity increase observed after 1000 cycles (2000 flexes) was 67%.

Example 7

A PTF copper conductor composition was prepared using copper flake (CI-1000F, Ames Goldsmith Corp, South Glen Falls, N.Y.) having an average particle size of 1.0 µm. An organic medium was prepared by dissolving a phenoxy resin (PKHH® resin from InChem Corp) having a number average molecular weight of approximately 20,000 in Dowanol® DPM dipropylene glycol methyl ether ((Dow Chemical Co., Midland, Mich.). The organic medium contained 20 wt % resin and 80 wt % solvent, wherein the wt % are based on the total weight of the organic medium. The copper powder was then dispersed in the organic medium.

The components of the PTF copper conductor composition were:

| | |
|---|---|
| 70.8 wt % | Copper flake powder |
| 14.7 wt % | Organic medium |
| 1.8 wt % | Triethanoiamine |
| 0.9 wt % | Tridecyl acid phosphate |
| 11.8 wt % | Dowanol ® DPM | wherein the wt % are based on the total weight of the composition.

The components were combined and mixed for 3 minutes in a Thinky-type mixer. The composition was used to screen print a 600 square serpentine pattern on Melinex® ST-505 polyester film (DuPont Teijin Films, Chester, Va.). Using a 325 mesh stainless steel screen, several patterns were printed, and the copper paste was dried at 80° C. for 5 min. in a forced air convection oven. The line resistance was then measured as approximately 1.2 Mohmn.

The dried serpentine patterns were then subjected to photonic sintering. A PulseForge 3200 sintering unit manufactured by NovaCentrix (Austin, Tex.) was employed. The unit was operated in Basic Mode. The process settings were as follows: pulse voltage: 200 V, pulse length: 1400 µsec, overlap factor: 3, web speed: 25 FPM. After processing, the measured line resistance was 39Ω. The average conductor thickness over the 600 square pattern was determined to be 7.3 µm using a profilometer. Therefore the resistivity was calculated to be 18.9 mΩ/☐/mil.

The crosshatch adhesion of the sintered conductor was measured according to procedure ASTM D3359. Square-shaped samples were printed on Melinex ST-505 and sintered using the same conditions outlined above. Adhesion to the polyester substrate was rated a four.

The resistivity of processed samples was measured as the samples aged under ambient conditions, 85185 conditions, and 80° C. aging in a forced air convection oven. The average resistivity change observed was 1.8%, 10.4%, and 8.2% respectively after 500 hr. aging time. The samples were not encapsulated. Crease resistance of the processed conductor traces was measured by inducing a hard crease using a cylindrical 2 kg weight. The average increase in resistivity of samples subjected to this treatment was 36%. Samples were also exposed to flex endurance testing by repeatedly bending the serpentine patterns at a 180 degree angle around a 0.25 inch mandrel. The average resistivity increase observed after 1000 cycles (2000 flexes) was 28%.

Example 8

A PTF copper conductor composition was prepared using a mixture of two copper flake powders (CI-4000F and CI-1000F, Ames Goldsmith Corp, South Glen Falls, N.Y.) having an average particle size of 4 µm and 1 µm respectively. An organic medium was prepared by dissolving a phenoxy resin (PKHH® resin from InChem Corp) having a number average molecular weight of approximately 20,000 in Dowanol® DPM dipropylene glycol methyl ether (Dow Chemical Co., Midland, Mich.). The organic medium contained 20 wt % resin and 80 wt % solvent, wherein the wt % are based on the total weight of the organic medium. The copper powder was then dispersed in the organic medium.

The components of the PTF copper conductor composition were:

| | |
|---|---|
| 55.5 wt % | CI-1000F Cu powder |
| 18.6 wt % | CI-4000F Cu powder |
| 18.5 wt % | Organic medium |
| 0.7 wt % | Triethanolamine |
| 6.7 wt % | Dowanol ® DPM | wherein the wt % are based on the total weight of the composition.

The components were combined and mixed for 3 minutes in a Thinky-type mixer. The composition was used to screen print a 600 square serpentine pattern on Melinex® ST-505 polyester film (DuPont Teijin Films, Chester, Va.). Using a 325 mesh stainless steel screen, several patterns were printed, and the copper paste was dried at 80° C. for 5 min. in a forced air convection oven. The line resistance was then measured as greater than two megaohms.

The dried serpentine patterns were then subjected to photonic sintering. A PulseForge 3200 sintering unit manufactured by NovaCentrix (Austin, Tex.) was employed. The unit was operated in Basic Mode. The process settings were as follows: pulse voltage: 240V, pulse length: 1000 µsec, overlap factor: 3, web speed: 25 FPM. After processing, the measured line resistance was 42Ω. The average conductor thickness over the 600 square pattern was determined to be 6.8 µm using a profilometer. Therefore the resistivity was calculated to be 19.0 mΩ/☐/mil.

The crosshatch adhesion of the sintered conductor was measured according to procedure ASTM D3359. Square-shaped samples were printed on Melinex ST-505 and sintered using the same conditions outlined above. Adhesion to the polyester substrate was rated a four.

Comparative Experiment A

A PTF copper conductor composition similar to that described in Example 3 above was prepared using the same components but without the addition of the triethanolamine reducing agent.

The components of the PTF copper conductor composition were:

| | |
|---|---|
| 76.9% | Copper powder |
| 19.3% | Organic medium (20% resin/80% solvent) |
| 3.8% | Dowanol ® DPM | wherein the wt % are based on the total weight of the composition

The components were combined and mixed for 3 minutes in a Thinky-type mixer. The composition was used to screen print a 600 square serpentine pattern on Melinex® ST-505 polyester film (DuPont Teijin AIMS, Chester, Va.). Using a 325 mesh stainless steel screen, several patterns were printed, and the copper paste was dried at 80° C. for 5 min. in a forced air convection oven. The line resistance was then measured as greater than two megaohms.

The dried serpentine patterns were then subjected to photonic sintering. A PulseForge 3200 sintering unit manufactured by NovaCentrix (Austin, Tex.) was employed. The unit was operated in Basic Mode. The process settings were as follows: pulse voltage: 260 V, pulse length: 800 μsec, overlap factor: 3, web speed: 25 FPM. After processing, the measured line resistance was greater than one megaohm.

Printed serpentines were also photonically sintered in the wet as-printed state. The process settings were as follows: pulse voltage: 260 V, pulse length: 800 μsec, overlap factor: 3, web speed: 25 FPM. After processing, the measured line resistance was greater than 1 megaohm.

Comparative Experiment B

A screen printable PTF copper oxide composition was prepared using copper oxide (Aldrich) having an average particle size of 50 nm. An aqueous medium was prepared by dissolving a polyvinylpyrrolidone (PVP K90 resin, Aldrich) having a weight average molecular weight of approximately 350,000 in water. The medium contained 20 wt % resin and 80 wt % water, wherein the wt % are based on the total weight of the aqueous medium. The copper oxide powder was then dispersed in the aqueous medium.

The components of the PTF copper oxide composition were:

| | | |
|---|---|---|
| 65.5 | wt % | copper oxide powder |
| 4.0 | wt % | polyvinylpyrrolidone |
| 16.0 | wt % | water |
| 3.0 | wt % | triethanolamirie |
| 10.0 | wt % | ethylene glycol |
| 1.5 | wt % | tergitol | wherein the wt % are based on the total weight of the composition.

The components were combined and mixed for 3 minutes in a Thinky-type mixer. The composition was used to screen print a 600 square serpentine pattern on Melinex® ST-505 polyester film (DuPont Teijin Films, Chester, Va.). Using a 325 mesh stainless steel screen, several patterns were printed, and the copper paste was dried at 80° C. for 10 min. in a forced air convection oven. The line resistance was then measured as greater than two megaohms.

The dried serpentine patterns were then subjected to photonic sintering. A PulseForge 3200 sintering unit manufactured by NovaCentrix (Austin, Tex.) was employed. The unit was operated in Basic Mode. The process settings were as follows: pulse voltage: 200V, pulse length: 2000 μsec, overlap factor: 3, web speed: 25 FPM. After processing, the measured line resistance was 110Ω. The average conductor thickness over the 600 square pattern was determined to be 7.1 μm using a profilometer. Therefore the resistivity was calculated to be 52 mΩ/□/mil. After sintering, the conductor had the appearance of copper on the front side but the appearance of the traces on the back side looking through the polyester film was still black, indicating the presence of unreduced copper oxide. Attempts to achieve complete reduction of copper oxide by altering the formulation and processing conditions were unsuccessful. More aggressive sintering ablated material from the surface of the printed traces and did not achieve complete reduction of copper oxide.

The crosshatch adhesion of the sintered conductor was measured according to procedure ASTM D3359. Square-shaped samples were printed on Melinex ST-505 and sintered using the same conditions outlined above. Adhesion to the polyester substrate was rated a one. A combination of adhesive and cohesive failure was observed.

Some processed traces were then encapsulated with a polyester encapsulant, others were encapsulated with a fluoropolymer encapsulant by screen printing organic solutions containing the dissolved resins and drying at 140° C. for 10 minutes. The encapsulated serpentines as well as the unencapsulated serpentines were then tested for durability by subjecting them to an 180° C. crease test. A 2 kg circular weight was rolled slowly over the folded serpentine to generate a hard crease in the conductor traces, the resistivity was measured before and after this treatment. The three sets of samples failed to generate a measurable line resistance after crease testing.

The sintered conductor traces, encapsulated and unencapsulated, were also subjected to flex endurance testing to evaluate overall durability. Samples were flexed 180 degrees around a 0.25 inch mandrel. The test samples were flexed so that the conductive traces were in tension and compression. Samples were tested for up to 1000 cycles (one cycle equals one compression flex and one tension flex). The three sets of samples failed to generate a measurable line resistance after 50 flex cycles.

Comparative Experiment C

A PTF copper conductor composition was prepared using Mitsui copper powder. The following ingredients were combined to prepare a low viscosity paste:

| | | |
|---|---|---|
| 40.5 | wt % | Copper powder |
| 0.6 | wt % | Tergitol NP-9 |
| 0.6 | wt % | BYK-020 |
| 4.0 | wt % | PVP K-90 |
| 14.5 | wt % | Glycerol |
| 7.3 | wt % | Ethylene glycol |
| 12.1 | wt % | Ascorbic acid |
| 20.2 | wt % | Deionized water | wherein the wt % are based on the total weight of the composition.

The components were combined and mixed for several minutes in a Thinky-type mixer to disperse the powder in the medium. The composition was used to screen print a 600 square serpentine pattern on Melinex® ST-505 polyester film (DuPont Teijin Films, Chester, Va.). Using a 325 mesh stainless steel screen, several patterns were printed, and the copper paste was dried at 80° C. for 5 min. in a forced air convection oven. The line resistance was then measured to be greater than 2 Mohm.

The dried serpentine patterns were then subjected to photonic sintering. A PulseForge 3200 sintering unit manufactured by NovaCentrix (Austin, Tex.) was employed. The unit was operated in Basic Mode. The process settings were as follows: pulse voltage: 200 V, pulse length: 1400 µsec, overlap factor: 3, web speed: 25 FPM. After processing, the measured line resistance was 84Ω. The average conductor thickness over the 600 square pattern was determined to be 4.3 µm using a profilometer. Therefore the resistivity was calculated to be 24.1 mΩ/□/mil.

The crosshatch adhesion of the sintered conductor was measured according to procedure ASTM D3359. Square-shaped samples were printed on Melinex ST-505 and sintered using the same conditions outlined above. Adhesion to the polyester substrate was rated a one to two.

Crease resistance of the processed conductor traces was measured by inducing a hard crease using a cylindrical 2 kg weight. The samples yielded no measurable resistance as a result of this test, indicating the integrity of the conductive trace was disrupted.

What is claimed is:

1. A polymer thick film copper conductor composition comprising:
    (a) 40 to 95 wt % copper powder possessing particles with an average particle size of 0.2 to 10 µm and a surface area/mass ratio in the range of 0.2 to 3.0 m$^2$/g; dispersed in
    (b) 4 to 35 wt % organic medium comprising
        (1) a resin selected from the group consisting of a phenoxy, urethane, oxazoline, and ester resin dissolved in
        (2) organic solvent selected from the group consisting of a dibasic ester, glycol ether, alcohol and mixtures thereof;
    (c) 0.25 to 5 wt % reducing agent comprising a hydroxyl containing compound; and
    (d) 0.0 to 5 wt % viscosity stabilizing agent comprising a carboxylic acid containing compound or phosphate containing compound;
    wherein the wt % are based on the total weight of said polymer thick film copper conductor composition.

2. The polymer thick film copper conductor composition of claim 1, wherein said copper powder particles are in flake form, said reducing agent is selected from the group consisting of monoethanolamine, diethanolamine, triethanolamine and malonic acid and said viscosity stabilizing agent is selected from the group consisting of malonic acid, malic acid, and tartaric acid.

3. A method for forming an electrical conductor in an electrical circuit, comprising:
    a) providing a substrate;
    b) providing a polymer thick film copper conductor composition comprising the polymer thick film copper conductor composition of claim 1;
    c) applying said polymer thick film copper conductor composition onto said substrate; and
    d) subjecting said polymer thick film copper conductor composition to photonic sintering to form said electrical conductor.

4. The method of claim 3, said method further comprising a step of drying said polymer thick film conductor composition, wherein said step of drying is carried out following step (c) but before step (d).

* * * * *